(12) United States Patent
Jung et al.

(10) Patent No.: US 10,672,911 B2
(45) Date of Patent: Jun. 2, 2020

(54) THIN FILM TRANSISTOR SUBSTRATE AND DISPLAY PANEL HAVING THE SAME

(71) Applicant: SAMSUNG DISPLAY CO., LTD., Yongin-Si, Gyeonggi-Do (KR)

(72) Inventors: Seung Ho Jung, Yongin-Si (KR); Chaun Gi Choi, Yongin-Si (KR); Hye Young Park, Yongin-Si (KR); Eun Young Lee, Yongin-Si (KR); Joo Hee Jeon, Yongin-Si (KR); Eun Jeong Cho, Yongin-Si (KR); Bo Geon Jeon, Yongin-Si (KR); Yung Bin Chung, Yongin-Si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 16/451,593

(22) Filed: Jun. 25, 2019

(65) Prior Publication Data

US 2019/0326442 A1  Oct. 24, 2019

Related U.S. Application Data

(62) Division of application No. 15/480,102, filed on Apr. 5, 2017, now Pat. No. 10,361,312, which is a division
(Continued)

(30) Foreign Application Priority Data

Apr. 30, 2015 (KR) .......................... 10-2015-0061482

(51) Int. Cl.
*H01L 27/12* (2006.01)
*H01L 29/786* (2006.01)
(Continued)

(52) U.S. Cl.
CPC .... *H01L 29/78603* (2013.01); *H01L 27/1218* (2013.01); *H01L 27/1225* (2013.01);
(Continued)

(58) Field of Classification Search
CPC ............. H01L 51/5256; H01L 51/0097; H01L 27/1225; H01L 2251/5338
See application file for complete search history.

(56) References Cited

U.S. PATENT DOCUMENTS

2008/0206967 A1* 8/2008 Miyairi ............... H01L 21/0237
438/479
2011/0294244 A1 12/2011 Hattori et al.
(Continued)

*Primary Examiner* — Elias Ullah
(74) *Attorney, Agent, or Firm* — F. Chau & Associates, LLC (57) ABSTRACT

A thin film transistor array panel device comprises: a base substrate; a barrier layer disposed over the base substrate and comprising a plurality of transparent material layers; and an array of thin film transistors disposed over the barrier layer. A difference between a refractive index of the barrier layer and a refractive index of the base substrate may be within about 6%. The transparent material layers may be arranged such that the transparent material layers having compressive residual stress and the transparent material layers having tensile residual stress are alternately stacked. Each of the transparent material layers may comprise silicon oxynitride (SiON).

16 Claims, 7 Drawing Sheets

Related U.S. Application Data of application No. 15/045,688, filed on Feb. 17, 2016, now Pat. No. 9,647,237.

(51) Int. Cl.
*H01L 51/52* (2006.01)
*H01L 51/00* (2006.01)
*H01L 29/78* (2006.01)
*H01L 27/32* (2006.01)

(52) U.S. Cl.
CPC ...... *H01L 29/7849* (2013.01); *H01L 29/7869* (2013.01); *H01L 29/78633* (2013.01); *H01L 51/0097* (2013.01); *H01L 51/5256* (2013.01); *H01L 27/3244* (2013.01); *H01L 27/3262* (2013.01); *H01L 2251/5338* (2013.01); *H01L 2251/55* (2013.01); *Y02E 10/549* (2013.01)

(56) References Cited

U.S. PATENT DOCUMENTS

| | | |
|---|---|---|
| 2015/0102324 A1 | 4/2015 | Lee |
| 2016/0313622 A1 | 10/2016 | Duan et al. |
| 2017/0207343 A1 | 7/2017 | Jung et al. |

* cited by examiner

THIN FILM TRANSISTOR SUBSTRATE AND DISPLAY PANEL HAVING THE SAME

CROSS-REFERENCE TO RELATED APPLICATIONS

This application is a divisional application of U.S. patent application Ser. No. 15/480,102, filed Apr. 5, 2017, which is a divisional of U.S. patent application Ser. No. 15/045,688, filed Feb. 17, 2016, now U.S. Pat. No. 9,647,237, which claims priority under 35 USC § 119 to Korean Patent Application No. 10-2015-0061482, filed on Apr. 30, 2015, in the Korean Intellectual Property Office (KIPO), the disclosures of which are incorporated by reference herein in their entireties.

BACKGROUND

1. Field

The present disclosure relates to a thin film transistor array panel and a display panel having the same.

2. Description of the Related Art

With development of the information-oriented society, various display panels such as an organic light emitting diode (OLE)) display panel, a liquid crystal display (LCD) panel, an electrophoresis (EPD) panel and an electro-wetting display (EWD) panel are being used.

In recent years, display devices have become thin and light weight, and highly mobile. Further, some display devices are even bendable or foldable. Such display devices may use a flexible substrate which includes a polymer resin instead of a glass substrate.

SUMMARY

An aspect may provide a thin film transistor substrate preventing moisture penetration and having improved light transmittance.

Another aspect may provide a display panel having the thin film transistor substrate.

One aspect of the invention provides a thin film transistor array panel device, which may comprise: a base substrate; a barrier layer disposed over the base substrate and comprising a plurality of transparent material layers, each of which is substantially transparent; and an array of thin film transistors disposed over the barrier layer, wherein a difference between a refractive index of the barrier layer and a refractive index of the base substrate is within about 6%.

In the foregoing device, a difference between a refractive index of each of the plurality of transparent material layers and the refractive index of the base substrate may be within about 6%. The plurality of transparent material layers may comprise first and second transparent material layers immediately neighboring each other without any intervening transparent material layer therebetween, wherein the first transparent material layer has compressive residual stress and the second transparent material layer has tensile residual stress. The barrier layer may comprise a multi-layered structure of the transparent material layers arranged such that the transparent material layers having compressive residual stress and the transparent material layers having tensile residual stress are alternately stacked. The plurality of transparent material layers may comprise an uppermost transparent material layer and a lowermost transparent material layer which have compressive residual stress.

Still in the foregoing device, the transparent material layers may be formed of the same material. Each of the transparent material layers may comprise silicon oxynitride (SiON). The device may further comprise a buffer layer disposed between the barrier layer and the thin film transistors, wherein the buffer layer is formed of the same material as that of the transparent material layers. Each thin film transistor may comprise a semiconductor active layer, a gate electrode, a source electrode and a drain electrode, wherein the thin film transistor array panel device further comprises a gate insulating layer disposed between the semiconductor active layer and the gate electrode, wherein the gate insulating layer is formed of the same material as that of the transparent material layers. The device may further comprise an interlayer insulating layer insulating the gate electrode and the source electrode and the drain electrode, wherein the interlayer insulating layer is formed of the same material as that of the transparent material layers. The base substrate may comprise one of polyethersulfone (PES), polyacrylate, polyetherimide (PEI), polyethyelenen naphthalate (PEN), polyethylene terephthalate (PET), polyphenylene sulfide (PPS), polyarylate (PAR), polyimide (PI), polycarbonate (PC), triacetate cellulose (TAC) or cellulose acetate propionate (CAP). The base substrate may comprise fiberglass reinforced plastic (FRP).

Another aspect of the invention provides a display panel which may comprise: the foregoing thin film transistor array panel device; and an array of pixels disposed over the thin film transistor array panel device.

In the foregoing display panel, a difference between a refractive index of each of the transparent material layers and the refractive index of the base substrate may be within about 6%. A first the plurality of transparent material layers may comprise first and second transparent material layers immediately neighboring each other without any intervening transparent material layer, wherein the first transparent material layer has compressive residual stress and the second transparent material layer has tensile residual stress. The barrier layer may comprise a multi-layered structure of the transparent material layers arranged such that the transparent material layers having compressive residual stress and the transparent material layers having tensile residual stress are alternately stacked. The plurality of transparent material layers may comprise an uppermost transparent material layer and a lowermost transparent material layer which have compressive residual stress.

Still in the foregoing display panel, each of the transparent material layers may comprise silicon oxynitride (SiON). The thin film transistor array panel device may further comprise a buffer layer disposed between the barrier layer and the thin film transistors, wherein the buffer layer is formed of the same material as that of the transparent material layers. Each thin film transistor may comprise a semiconductor active layer, a gate electrode, a source electrode and a drain electrode, wherein the thin film transistor array panel device further comprises a gate insulating layer disposed between the semiconductor active layer and the gate electrode, wherein the gate insulating layer is formed of the same material as that of the transparent material layers.

Yet in the foregoing display panel, the display panel may further comprise an interlayer insulating layer insulating the gate electrode and the source electrode and the drain electrode, wherein the interlayer insulating layer is formed of the same material as that of the transparent material layers. The display panel may further comprise an encapsulating panel disposed over the thin film transistor array panel for protecting the pixels from external substances, wherein each pixel comprises a light emitting diode.

Still another aspect of the invention provides a thin film transistor array panel device, which may comprise: a base substrate; a barrier layer disposed over the base substrate and comprising a plurality of transparent material layers, each of which is substantially transparent; and an array of thin film transistors disposed over the barrier layer, wherein the plurality of transparent material layers comprise first and second transparent material layers immediately neighboring each other without any intervening transparent material layer therebetween, wherein the first transparent material layer has compressive residual stress and the second transparent material layer has tensile residual stress.

In the foregoing device, the barrier layer may comprise a multi-layered structure of the transparent material layers arranged such that the transparent material layers having compressive residual stress and the transparent material layers having tensile residual stress are alternately stacked. The plurality of transparent material layers may comprise an uppermost transparent material layer and a lowermost transparent material layer which have compressive residual stress. Each of the transparent material layers may comprise silicon oxynitride (SiON). The device may further comprise a buffer layer disposed between the barrier layer and the thin film transistors, wherein the buffer layer is formed of the same material as that of the transparent material layers.

Still in the foregoing device, each thin film transistor may comprise a semiconductor active layer, a gate electrode, a source electrode and a drain electrode, wherein the thin film transistor array panel device further comprises a gate insulating layer disposed between the semiconductor active layer and the gate electrode, wherein the gate insulating layer is formed of the same material as that of the transparent material layers. The device may further comprise an interlayer insulating layer insulating the gate electrode and the source electrode and the drain electrode, wherein the interlayer insulating layer is formed of the same material as that of the transparent material layers. A difference between a refractive index of the transparent material layers and a refractive index of the base substrate may be within about 6%, wherein the thin film transistor array panel device is flexible.

Yet another aspect of the invention provides a display panel, which may comprise: the foregoing thin film transistor array panel device; and an array of pixels disposed over the thin film transistor array panel device.

In the foregoing display panel, the barrier layer may comprise a multi-layered structure of the transparent material layers arranged such that the transparent material layers having compressive residual stress and the transparent material layers having tensile residual stress are alternately stacked. The plurality of transparent material layers may comprise an uppermost transparent material layer and a lowermost transparent material layer which have compressive residual stress. Each of the transparent material layers may comprise silicon oxynitride (SiON), wherein the thin film transistor array panel device is flexible. The thin film transistor array panel device may further comprise a buffer layer disposed between the barrier layer and the thin film transistors, wherein the buffer layer is formed of the same material as that of the transparent material layers. Each thin film transistor may comprise a semiconductor active layer, a gate electrode, a source electrode and a drain electrode, wherein the thin film transistor array panel device further comprises a gate insulating layer disposed between the semiconductor active layer and the gate electrode, wherein the gate insulating layer is formed of the same material as that of the transparent material layers. The thin film transistor array panel device may further comprise an interlayer insulating layer insulating the gate electrode and the source electrode and the drain electrode, wherein the interlayer insulating layer is formed of the same material as that of the transparent material layers.

Still in the foregoing display panel, a difference between a refractive index of the transparent material layers and the refractive index of the base substrate may be within about 6%. The display panel may further comprise an encapsulating panel disposed over the thin film transistor array panel for protecting the pixels from external substances, wherein each pixel comprises a light emitting diode.

A further aspect of the invention provides a thin film transistor array panel device, which may comprise: a base substrate; a barrier layer disposed over the base substrate and comprising a plurality of transparent material layers, each of which is substantially transparent and comprises silicon oxynitride (SiON); and an array of thin film transistors disposed over the barrier layer.

In the foregoing device, the plurality of transparent material layers may comprise first and second transparent material layers immediately neighboring each other without any intervening transparent material layer therebetween, wherein the first transparent material layer has compressive residual stress and the second transparent material layer has tensile residual stress. The barrier layer may comprise a multi-layered structure of the transparent material layers arranged such that the transparent material layers having compressive residual stress and the transparent material layers having tensile residual stress are alternately stacked. The plurality of transparent material layers may comprise an uppermost transparent material layer and lowermost transparent material layer which have compressive residual stress. The device may further comprise a buffer layer disposed between the barrier layer and the thin film transistors, wherein the buffer layer comprises silicon oxynitride (SiON).

Still in the foregoing device, each thin film transistor may comprise a semiconductor active layer, a gate electrode, a source electrode and a drain electrode, wherein the thin film transistor array panel device further comprises a gate insulating layer disposed between the semiconductor active layer and the gate electrode, wherein the gate insulating layer comprises silicon oxynitride (SiON). The device may further comprise an interlayer insulating layer insulating the gate electrode and the source electrode and the drain electrode, wherein the interlayer insulating layer comprises silicon oxynitride (SiON). A difference between a refractive index of the transparent material layers and a refractive index of the base substrate may be within about 6%.

Still a further aspect of the invention provides a display panel, which may comprise: the foregoing thin film transistor array panel device; and an array of pixels disposed over the thin film transistor array panel.

In the foregoing display panel, the plurality of transparent material layers may comprise first and second transparent material layers immediately neighboring each other without any intervening transparent material layer therebetween, wherein the first transparent material layer has compressive residual stress and the second transparent material layer has tensile residual stress. The barrier layer may comprise a multi-layered structure of the transparent material layers arranged such that the transparent material layers having compressive residual stress and the transparent material layers having tensile residual stress are alternately stacked. The plurality of transparent material layers may comprise an uppermost transparent material layer and a lowermost transparent material layer which have compressive residual stress.

Yet in the display panel, the thin film transistor array panel device may further comprise a buffer layer disposed between the barrier layer and the thin film transistors, wherein the buffer layer comprises silicon oxynitride (SiON). Each thin film transistor comprises a semiconductor active layer, a gate electrode, a source electrode and a drain electrode, wherein the thin film transistor array panel device further comprises a gate insulating layer disposed between the semiconductor active layer and the gate electrode, wherein the gate insulating layer comprises silicon oxynitride (SiON). The thin film transistor array panel device may further comprise an interlayer insulating layer insulating the gate electrode and the source electrode and the drain electrode, wherein the interlayer insulating layer comprises silicon oxynitride (SiON). A difference between a refractive index of the transparent material layers and a refractive index of the base substrate may be within about 5.5%.

In an embodiment, a thin film transistor substrate may include a base substrate, a barrier layer disposed on the base substrate and including a plurality of transparent material layer and a thin film transistor disposed on the barrier layer. The difference between a refractive index of the barrier layer and a refractive index of the base substrate may be within 6%.

The difference between a refractive index of the plurality of transparent material layers and the refractive index of the base substrate may be within 6%.

One of the transparent material layers adjacent to each other may have compressive stress and other one may have tensile stress. The barrier layer may include the transparent material layers having compressive stress and the transparent material layers having tensile stress, alternately stacked. The uppermost transparent material layer and the lowermost transparent material layer may have compressive stress.

The thin film transistor substrate may further include a buffer layer disposed between the barrier layer and the thin film transistor. The buffer layer may include a same material as the transparent material layers.

The thin film transistor may include a semiconductor active layer, a gate electrode, a gate insulating layer disposed between the semiconductor active layer and the gate electrode, a source electrode and a drain electrode. The gate insulating layer may include a same material as the transparent material layers.

The thin film transistor substrate may further include an interlayer insulating layer insulating the gate electrode and the source electrode and the drain electrode. The interlayer insulating layer may include a same material as the transparent material layers.

The transparent material layers may include the same material. The transparent material layers may include silicon oxynitride (SiON).

The base substrate may include one of polyethersulfone (PES), polyacrylate, polyetherimide (PEI), polyethyelenen naphthalate (PEN), polyethylene terephthalate (PET), polyphenylene sulfide (PPS), polyarylate (PAR), polyimide (PI), polycarbonate (PC), triacetate cellulose (TAC) or cellulose acetate propionate (CAP). The base substrate may include fiber glass reinforced plastic (FRP).

In an embodiment, a thin film transistor substrate may include a base substrate, a barrier layer disposed on the base substrate and including a plurality of transparent material layer and a thin film transistor disposed on the barrier layer. Remaining stress of the transparent material layers that are adjacent to each other may have different stress properties.

In an embodiment, a thin film transistor substrate may include a base substrate, a barrier layer disposed on the base substrate and including a plurality of transparent material layers including silicon oxynitride (SiON) and a thin film transistor disposed on the barrier layer.

In an embodiment, a display panel may include the thin film transistor substrate and an emitting device disposed on the thin film transistor substrate.

An encapsulating member that isolates the emitting device from an external environment may be further included. The encapsulating member may be an opposed substrate facing the thin film transistor substrate.

The display panel may include a barrier layer disposed on a base substrate, thereby preventing moisture from penetrating into a display device.

Since the difference between the refractive index of the barrier layer and the refractive index of the base substrate is small, the light may be prevented from being reflected at an interface between the barrier layer and the base substrate. Accordingly, the light transmittance of the display panel may be improved.

As for the barrier layer, a plurality of transparent material layers may be stacked, and one of the transparent material layers adjacent to each other may have compressive stress while other one may have tensile stress. Accordingly, residual stress inside the barrier layer may be relieved. Therefore, the stress which is applied to the base substrate by the barrier layer may be reduced.

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only some embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the invention thereto. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
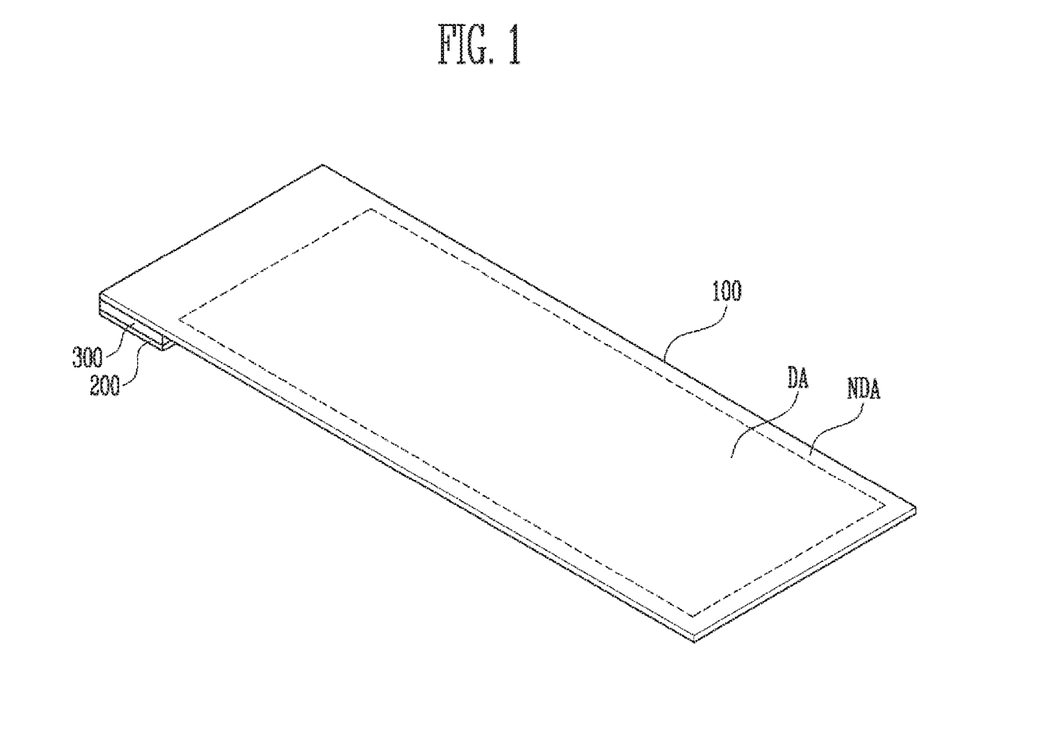
FIG. 1 is an exploded perspective view for explaining a display device in accordance with an embodiment.
Figure 2:
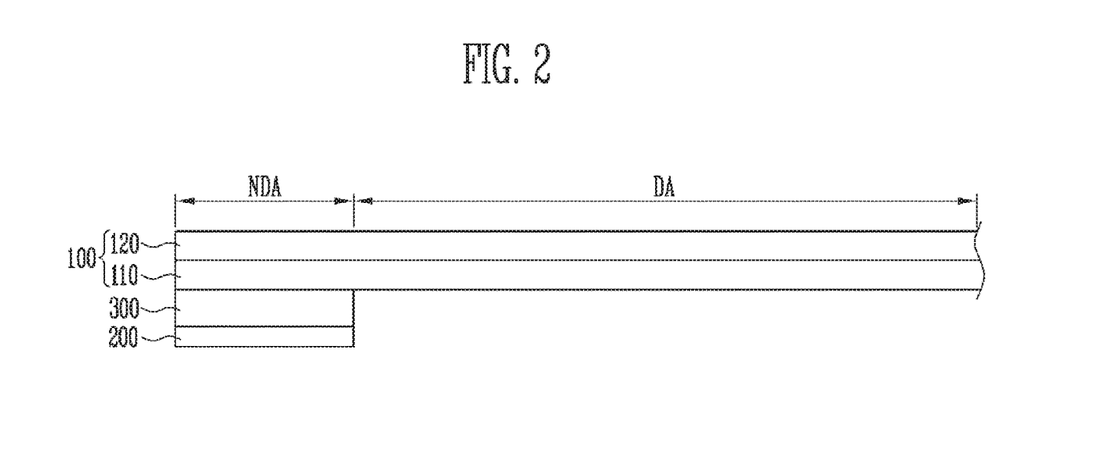
FIG. 2 is a cross-sectional view of the display device shown in FIG. 1.

FIG. 1 is an exploded perspective view for explaining a display device in accordance with an embodiment. FIG. 2 is a cross-sectional view of the display device shown in FIG. 1.

Referring to FIGS. 1 and 2, a display device may include a display panel 100, a housing 200 and a driving circuit part 300.

In embodiments, the display panel 100 may be flexible. The display panel 100 may be substantially transparent such that a substantial amount light beams passes therethrough. In addition, the display panel 100 may include a display area DA for displaying images and a non-display area at a periphery of the display area DA.

However, the display panel 100 is not limited thereto. For example, but without limitation thereto, a self light emission type display panel such as an organic light emitting display (OLED) panel may be used for the display panel 100. In addition, a nonemissive display panel such as a liquid crystal display (LCD) panel, an electro-phoretic display (EPD) panel, and an electro-wetting display (EWD) panel may be used for the display panel 100. If a nonemissive display panel is used for the display panel 100, a mobile device employing the display panel may include a back-light unit for supplying light to the display panel 100. In an embodiment, the organic light emitting display panel is described as an example of the display panel 100.

The display area DA may include a plurality of pixel areas. Lights emitted from the pixel areas may have different colors. For example, but without limitation thereto, light emitted from the pixel areas may have one of the following colors: red; green; blue; cyan; magenta; or yellow.

The display panel 100 may include a thin film transistor substrate 110 which may be referred to as a thin-film transistor array panel, a display device disposed in each of the pixel areas on the thin film transistor substrate 110 and a sealing member 120 that can be referred as a encapsulation panel separating or isolating the display device from an external environment. The display devices may be disposed in each of the pixel areas. In embodiments, for providing a flexible display, the thin film transistor array panel 110 and the encapsulation panel 120 are flexible.

In each of the pixel areas, the thin film transistor substrate 110 may include a base substrate and at least one thin film transistor disposed on the base substrate. In embodiments, an array of thin film transistors is formed over the base substrate.

In embodiments, the display device may be an organic light emitting device. For example, but without limitation thereto, the display device may include a first electrode coupling to the thin film transistor, an organic layer disposed on the first electrode and a second electrode disposed on the organic layer. One of the first electrode and the second electrode may be an anode electrode, and the other may be a cathode electrode. At least one of the first electrode and the second electrode may be a transmissive electrode. For example, but without limitation thereto, if the display device is an organic light emitting device of a bottom emission type, the first electrode may be a transmissive electrode, and the second electrode may be a reflective electrode. If the display device is an organic light emitting device of a top emission type, the first electrode may be a reflective electrode, and the second electrode may be a transmissive electrode. If the display device is an organic light emitting device of a both top and bottom emission type, the first electrode and the second electrode may be transmissive electrodes.

The organic layer may include at least an emitting layer (EML). Generally, the organic layer may have a multi-layered thin film structure. The color of the light from the emitting layer may be one of red, green, blue or white. However, it is not limited thereto. For example, but without limitation thereto, the color of the light from the emitting layer may be one of magenta, cyan, or yellow.

The sealing member 120 may isolate the display device from the external environment. The sealing member 120 may be a sealing substrate facing the thin film transistor substrate 110. The sealing member 120 may, through a sealant, be attached to the thin film transistor substrate 110. The sealant may be disposed in the non-display area NDA.

The sealing member 120 may be a sealing layer including a plurality of inorganic layers and a plurality of organic layers covering the display device OLED. The sealing layer may prevent penetration of moisture and oxygen into the display device OLED on the second electrode E2.

An area of the sealing member 120 may be smaller than or substantially the same as that of the thin film transistor substrate 110. For example, but without limitation thereto, the sealing member 120 may over the display area DA of the thin film transistor substrate 110 and expose a part of the non-display area NDA.

The housing 200 may include a material having an elastic or flexible property. The housing 200 may accommodate at least a part of the display panel 100 and the driving circuit part 300.

The driving circuit part 300 may be disposed between the display panel 100 and the housing 200. The driving circuit part 300 may include a driving IC, a coupling film and a circuit board.

The driving IC may include a gate driving IC and a data driving IC for a driving chip for driving the display panel 100.

The coupling film may include a plurality of wires formed on a film-typed substrate. The coupling film may mount the driving IC with a tape carrier package (TCP) or a chip on film (COF) to be electrically coupled to the thin film transistor substrate 110.

The circuit board may be electrically coupled to the thin film transistor substrate 110 via the coupling film and may supply a gate signal and a data signal to the thin film transistor substrate 110. The circuit board may be a printed circuit board (CPB) or a flexible printed circuit board (FPCB). Various electronic devices including a power unit and a controller may be mounted on the circuit board.

Figure 3:
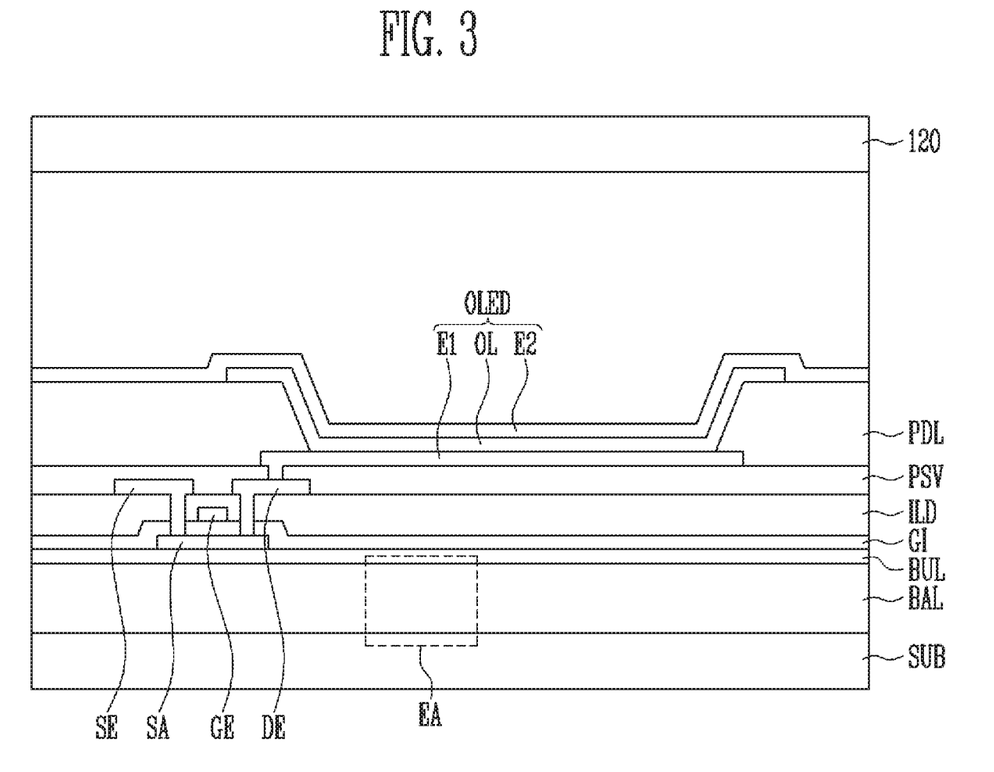
FIG. 3 is a cross-sectional view for explaining the display device shown in FIG. 1.
Figure 4:
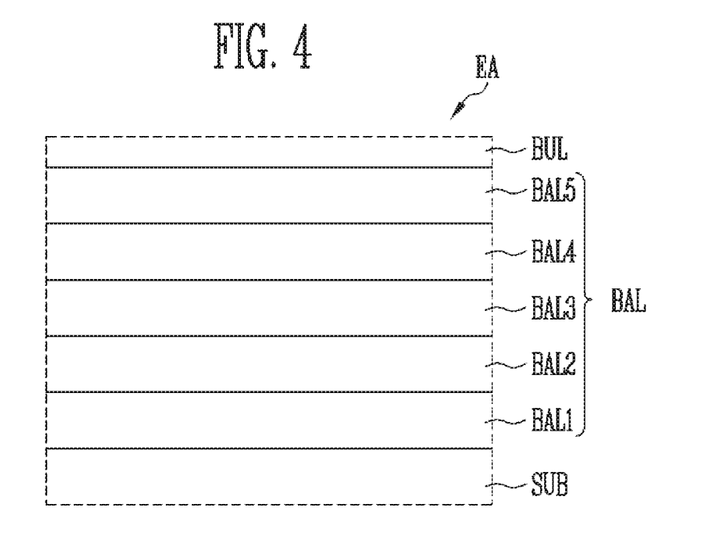
FIG. 4 is an expanded view of an area EA shown in FIG. 3.

FIG. 3 is a cross-sectional view for explaining the display device shown in FIG. 1. FIG. 4 is an expanded view of an area EA shown in FIG. 3.

Referring to FIGS. 1 to 4, in embodiments, a display panel 100 may include a thin film transistor substrate 110, a display device OLED which is an organic light emitting diode and disposed on the thin film transistor substrate 110 and a sealing member 120 isolating the display device OLED from an external environment.

The thin film transistor substrate 110 may include a base substrate SUB and at least one thin film transistor disposed on the base substrate SUB.

The base substrate SUB may be a flexible substrate. The base substrate SUB may be one of film base substrate and plastic base substrate including high molecular organic matters. For example, but without limitation thereto, the base substrate SUB may include one of polyethersulfone (PES), polyacrylate, polyetherimide (PEI), polyethyelenen naphthalate (PEN), polyethylene terephthalate (PET), polyphenylene sulfide (PPS), polyarylate (PAR), polyimide (PI), polycarbonate (PC), triacetate cellulose (TAC) or cellulose acetate propionate (CAP). The base substrate SUB may include fiber glass reinforced plastic (FRP).

In embodiments, a material used for the base substrate SUB may have resistance (thermal resistance) to high processing temperature during a process of manufacturing the display panel 100.

A barrier layer BAL may be disposed between the base substrate SUB and the thin film transistor. In embodiments, the barrier layer BAL contacts the base substrate. Here, a difference between a refractive index of the barrier layer BAL and a refractive index of the base substrate SUB may be about 6% or less. If the difference between the refractive index of the barrier layer BAL and the refractive index of the base substrate SUB is less than about 6%, reflectivity of light on an interface of the barrier layer BAL and the base substrate SUB may be sufficiently small to minimize or avoid deterioration of the light transmittance of the thin film transistor substrate 110. In embodiments, the difference between the refractive index of the barrier layer BAL and the refractive index of the base substrate SUB may be about 1%, about 1.3%, about 1.6%, about 1.9%, about 2%, about 2.3%, about 2.5%, about 2.7%, about 3%, about 3.2%, about 3.5%, about 3.8%, about 4.2%, about 4.7%, about 5.1%, about 5.5%, about 5.8%, about 6% or about 6.5%. In an embodiment, the difference between the refractive index of the barrier layer BAL and the refractive index of the base substrate SUB is a number within a numerical range between two selected from the afore-mentioned numbers. For example, the difference may be about 4.5%.

In embodiments, the barrier layer BAL is formed to inhibit moisture and oxygen from penetrating into the display panel to reach the semiconductor active layer SA of the thin film transistor. Further, the barrier layer may inhibit impurities from being diffused from the base substrate SUB so as to minimize the dispersion of the impurities to the semiconductor active layer SA. To this end, in embodiments, the barrier layer may be formed a material having characteristics of blocking moisture, oxygen and/or doping impurities. Further, the barrier layer may be formed to have a thickness sufficient to block the moisture, oxygen and/or doping impurities.

The barrier layer BAL may have a structure of a plurality of transparent active layers BAL1, BAL2, BAL3, BAL4 and BAL5. The refractive index of the transparent material layers BAL1, BAL2, BAL3, BAL4 and BAL5 and the refractive index of the base substrate SUB may be substantially the same. Also, the difference between the refractive index of the transparent material layers BAL1, BAL2, BAL3, BAL4 and BAL5 may be about 6% or less. For example, but without limitation thereto, the transparent material layers BAL1, BAL2, BAL3, BAL4 and BAL5 may include the same materials, and the refractive index of the transparent material layers BAL1, BAL2, BAL3, BAL4 and BAL5 may be substantially the same. In embodiments, two immediately neighboring layers among the plurality of transparent material layers contact each other, and no intervening layer or portion is provided therebetween.

Residual stress of one of the transparent material layers BAL1, BAL2, BAL3, BAL4 and BAL5 is different from that of immediately neighboring one of another the transparent material layers BAL1, BAL2, BAL3, BAL4 and BAL5. For example, the transparent material layer BAL2 has tensile residual stress while the transparent material layers BAL1 and BAL3 have compressive residual stress. In embodiments, the number of the transparent material layers BAL1, BAL2, BAL3, BAL4 and BAL5 may be an odd number. Also, in embodiments, the residual stress of the uppermost transparent material layer and the lowermost transparent material layer may be compressive residual stress, but not limited thereto.

For example, in embodiments illustrated in FIG. 4, the barrier layer BAL may include first to fifth transparent material layers BAL1, BAL2, BAL3, BAL4 and BAL5.

The residual stress of the first transparent material layer BAL1, the third transparent material layer BAL3 and the fifth transparent material layer BAL5 may have the same residual stress properties. For example, but without limitation thereto, the first transparent material layer BAL1, the third transparent material layer BAL3, and the fifth transparent material layer BAL5 may be compressive residual stress.

The residual stress of the second transparent material layer BAL2 and the fourth transparent material layer BAL4 may have the same residual stress properties. For example, but without limitation thereto, the residual stress of the second transparent material layer BAL2 and the fourth transparent material layer BAL4 may be tensile residual stress.

In the barrier layer BAL, since transparent material layers BAL1, BAL2, BAL3, BAL4 and BAL5 which have different residual stress properties are alternately stacked, the residual stress between the transparent material layers BAL1, BAL2, BAL3, BAL4 and BAL5 may be relaxed. Accordingly, compared to the barrier layer BAL of a single layer structure, the barrier layer BAL may maintain a state in which the residual stress is relaxed.

In addition, compared to the barrier layer of the single layer structure, the barrier layer BAL may include the plurality of transparent material layers BAL1, BAL2, BAL3, BAL4 and BAL5. Therefore, the barrier layer BAL may reduce penetration of moisture and impurities occurring due to pin-hole effect.

The transparent material layers BAL1, BAL2, BAL3, BAL4 and BAL5 may include one of silicon oxide (SiOx), silicon nitride (SiNx) or silicon oxynitride (SiON). For example, but without limitation thereto, the transparent material layers BAL1, BAL2, BAL3, BAL4 and BAL5 may include silicon oxynitride (SiON). The silicon oxynitride may easily control the refractive index depending on content of oxygen and nitrogen. If the content of nitrogen increases, the refractive index of the silicon oxynitride may increase. Furthermore, if the content of oxygen increases, the refractive index of the silicon oxynitride may decrease.

A buffer layer BUL may be disposed between the thin film transistor array and the barrier layer BAL. In embodiments, the buffer layer BUL contacts the layer BAL5 of the barrier layer. The buffer layer BUL may include a material that is the same as the transparent material layers BAL1, BAL2, BAL3, BAL4 and BAL5, for example, but without limitation thereto, silicon oxynitride (SiON). In embodiments, the buffer layer BUL may have substantially the same refractive index as the transparent material layers BAL1, BAL2, BAL3, BAL4 and BAL5. Therefore, the reflection of the light at an interface between the buffer layer BUL and the fifth transparent material layer BAL5 may be minimized or reduced as the difference in the refractive index of the buffer layer BUL and the fifth transparent material layer BAL5 is sufficiently small or there is no substantial difference of the refractive index between the layers BUL and BAL5.

The thin film transistor may be disposed on the buffer layer BUL. The thin film transistor may include the semiconductor active layer SA, a gate electrode GE, a source electrode SE and a drain electrode DE.

The semiconductor active layer SA may be disposed on the buffer layer BL. The semiconductor active layer SA may include one of amorphous silicon (a-Si), polycrystalline silicon (p-Si) or oxide semiconductor. An area in contact with the source electrode SE and the drain electrode DE in the semiconductor active layer SA may be a source area and a drain area into which impurities are doped or injected. An area between the source area and the drain area may be a channel area. The oxide semiconductor may include at least one of Zn, In, Ga, Sn or any mixture thereof. For example, but without limitation thereto, the oxide semiconductor may include indium-gallium-zinc oxide (IGZO).

In embodiments, if the semiconductor active layer SA includes an oxide semiconductor, a light blocking layer may be disposed at an upper portion or a lower portion of the semiconductor active layer SA to block light flowing into the semiconductor active layer SA.

A gate insulating layer GI may be disposed on the semiconductor active layer SA. The gate insulating layer GI may cover the semiconductor active layer SA and insulate the semiconductor active layer SA and the gate electrode GE. The gate insulating layer GI may include at least one silicon oxynitride (SiON). For example, but without limitation thereto, the gate insulating layer GI may include a material that is the same as the first to fifth transparent material layers BAL1, BAL2, BAL3, BAL4 and BAL5, for example, but without limitation thereto, silicon oxynitride (SiON). The gate insulating layer CGI may have substantially the same refractive index as the buffer layer BUL. Accordingly, the light may be prevented from being reflected from an interface between the gate insulating layer GI and the buffer layer BUL due to the difference in refractive index of the gate insulating layer GI and the buffer layer BUL.

The gate insulating layer GI may include a first layer which includes silicon oxide (SiOX) disposed on the semiconductor layer SA and a second layer disposed on the first layer and which includes silicon oxynitride. The first layer which includes the silicon oxide may have superior adhesive strength with the semiconductor active layer SA. Also, interface stability of the first layer and the semiconductor active layer SA may be superior.

The gate electrode GE may be disposed on the gate insulating layer GI. The gate electrode GE may be disposed overlapping the semiconductor active layer SA. The gate electrode GE may include at least one of aluminum (Al), aluminum alloy (Al alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc) or any alloy thereof.

An interlayer insulating layer ILD may be disposed on the gate electrode GE. The interlayer insulating layer ILD may insulate the gate electrode GE and the source electrode and the drain electrode DE. The interlayer insulating layer ILD may include the material that is the same as the first to fifth transparent material layers BAL1, BAL2, BAL3, BAL4 and BAL5, for example, but without limitation thereto, silicon oxynitride (SiON). In embodiments, the interlayer insulating layer ILD may have substantially the same refractive index as the gate insulating layer GI. Accordingly, the light may be prevented from being reflected from the interface between the interlayer insulating layer ILD and the gate insulating layer GI due to the difference in the refractive index of the interlayer insulating layer ILD and the gate insulating layer GI.

The source electrode SE and the drain electrode DE may be disposed on the interlayer insulating layer ILD. The source electrode SE and the drain electrode DE may be insulated from the gate electrode GE due to the interlayer insulating layer ILD. The source electrode SE and the drain electrode DE may contact the source area and the drain area.

In an embodiment, an example of the thin film transistor of a top gate structure is given. However, it should not be limited thereto. For example, but without limitation thereto, the thin film transistor may be a thin film transistor having a bottom gate structure.

A protective layer PSV may be disposed on the base substrate SUB where the thin film transistor is disposed. A part of the protective layer PSV may be removed and expose a part of the drain electrode DE. The protective layer PSV may include at least one layer. For example, but without limitation thereto, the protective layer PSV may be an organic protective layer. The organic protective layer PSV may include one of acryl, polyimide (PI), polyamide (PA), or benzocyclobutene (BCB). The organic protective layer may be transparent and have fluidity and it may be a planarizing layer capable of flattening by alleviating a bend or a curve of a structure of a lower portion.

The protective layer PSV may include an inorganic protective layer and an organic protective layer disposed on the inorganic protective layer. The inorganic protective layer may include the material that is the same as the first to fifth transparent material layers BAL1, BAL2, BAL3, BAL4 and BAL5, for example, but without limitation, silicon oxynitride (SiON). In embodiments, the inorganic protective layer may have substantially the same refractive index as the interlayer insulating layer ILD. Accordingly, the light may be prevented from being reflected from the interface between the inorganic protective layer and the interlayer insulating layer ILD due to the difference in the refractive index of the inorganic protective layer and the interlayer insulating layer ILD. In embodiments, all the transparent material layers of the barrier layer, the gate insulation layer, the interlayer insulation layer and the protective layer may be formed of the same material, for example, silicon oxide (SiOx), silicon nitride (SiNx) or silicon oxynitride (SiON), and may have substantially the same refractive index.

The display device OLED that contacts the drain electrode DE of the thin film transistor may be disposed on the protective layer PSV. The display device OLED may be an organic light emitting device. Depending on the emission form, the display device OLED may be one of an organic light emitting device of a bottom emission type, an organic light emitting device of a top emission type or an organic light emitting device of both sided emission type. In an embodiment, an example of the display device OLED being an organic light emitting device of a bottom type is provided.

The display device OLED may include a first electrode E1 which is a transmissive electrode capable of allowing light to pass through, an organic layer OL disposed on the first electrode E1 and a second electrode E2 which is a reflective electrode disposed on the organic layer OL and capable of reflecting light.

The first electrode E1 may come in contact with the drain electrode DE. The first electrode E1 may be a conductive layer including a transparent conductive oxide of one of indium tin oxide (ITO), indium zinc oxide (IZO), aluminum zinc oxide (AZO), gallium doped zinc oxide (GZO), zinc tin oxide (ZTO), gallium tin oxide (GTO) or fluorine doped tin oxide (FTO).

A pixel defining layer PDL may be disposed on the first electrode E1. The pixel defining layer PDL may be open, and the open area may expose the first electrode E1, especially a part of the transparent conductive layer E12.

The pixel defining layer PDL may include an organic insulating material. For example, but without limitation thereto, the pixel defining layer PDL may include at least one of polystyrene, poly(methyl methacrylate) (PMMA), polyacrylonitrile (PAN), polyamide, polyimide, polyarylether, heterocyclic polymer, parylene, fluorinated polymer, epoxy resin, benzocyclobutene series resin, siloxane series resin or silane resin.

An organic layer OL may be disposed on the first electrode E1 which is exposed by the pixel defining layer PDL. The organic layer OL may include at least an emitting layer EML and generally have a multi-layer thin film structure. For example, but without limitation thereto, the organic layer OL may include a hole injection layer HIL injecting holes, a hole transport layer HTL having superior transportation of holes and increasing an opportunity to re-couple holes and electrons by suppressing movement of electrons that were not coupled in the emitting layer EML, the emitting layer EML emitting light due to re-coupling of the injected electrons and holes, a hole blocking layer HBL suppressing movement of hoes that were not coupled in the emitting layer EML, an electron transport layer ETL smoothly transporting electrons to the emitting layer EML and an electron injection layer EIL injecting electrons. The color of the light generated from the emitting layer may be one of red, green, blue or white, but it is not limited thereto. For example, but without limitation thereto, the color of the light generated from the emitting layer of the organic layer OL may be one of magenta, cyan or yellow.

The second electrode E2 may be disposed on the organic layer OL. The second electrode E2 may include a material having a lower work function than the first electrode E1, for example, but without limitation thereto, at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or any alloy thereof. A conductive layer for preventing IR-drop of the second electrode E2 may be further included on the second electrode E2.

The sealing member 120 may be a sealing substrate facing the thin film transistor substrate 110. The sealing member 120 may include a same material as the base substrate SUB. The sealing member 120 may be a flexible substrate.

The sealing member 120 may isolate the display device OLED from the external environment and may be attached to the thin film transistor substrate 110 through a sealant. The sealant may be disposed in the non-display area NDA.

The sealing member 120 may be a sealing layer including a plurality of inorganic layers and a plurality of organic layers covering the display device OLED. The sealing layer may prevent penetration of moisture and oxygen into the display device OLED on the second electrode E2. The organic layer may include at least one of epoxy, polyimide, polyethylene terephthalate, polycarbonate, polyethylene or polyacrylate. The inorganic layer may include at least one of silicon oxide (SiOx), silicon nitride (SiNx), silicon oxynitride (SiON), aluminum oxide ($Al_2O_3$), titanium oxide ($TiO_2$), zirconium oxide (ZrOx) or zinc oxide (ZnO).

An area of the sealing member 120 may be smaller than or the same as an area of the thin film transistor 110. For example, but without limitation thereto, the sealing member 120 may cover the display area DA of the thin film transistor substrate 110 and expose a part of the non-display area NDA.

The display panel 100 may further include a filler filling a space between the thin film transistor substrate 110 and the sealing member 120. The filler may prevent damage to the display device OLED from an external impact.

The filler may include a material that is liquid or gel-like, which is colorless, capable of allowing light to pass through. For example, but without limitation thereto, as a gel-like material, the filler may include at least one of bisphenol A-type epoxy, cycloaliphatic epoxy resin, phenyl silicon resin or rubber, acrylic epoxy resin, or aliphatic urethane acrylate. Also, for a liquid material, the filler may include at least one of hexamethyldisiloxane, octamethyltrisiloxane, decamethyltetrasiloxane, or dodecamethylpentasiloxane, polydimethylsiloxanes.

Also, the filler may further include a moisture absorption material capable of absorbing moisture. Accordingly, the filler may prevent moisture which passed through the sealing member 120 from penetrating into the display device OLED.

The refractive index of the barrier layer BAL the refractive index of the buffer layer BUL, the refractive index of the gate insulating layer GI, and the refractive index of the interlayer insulating layer may be different from the refractive index of the base substrate SUB within about 6%. Therefore, the display device may prevent the light which is emitted from the display device OLED from being lost or reduce the loss of the light as a result of total reflection and side reflection due to the difference in interlayer refractive index. Therefore, light extraction efficiency of the display device may increase.

In the barrier layer BAL, the transparent material layers BAL1, BAL2, BAL3, BAL4 and BAL5 having different stress properties in which residual stress is different from each other may be alternately stacked. Therefore, residual stress acting on interactions between the transparent material layers BAL1, BAL2, BAL3, BAL4 and BAL5 may be relieved. In embodiments, the stress that is applied to the base substrate SUB due to the barrier layer BAL may be reduced. Accordingly, for the display device including the barrier layer BAL, there may be reduced concern for crack which may occur due to residual stress of the barrier layer BAL.

Figure 10:
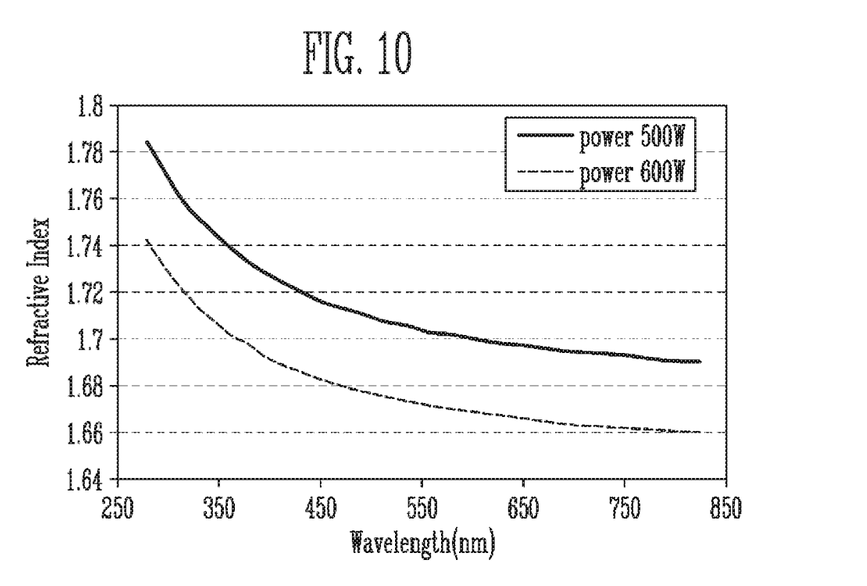
FIG. 10 is a graph for explaining a change in a refractive index of a transparent material layer in accordance with an applied power.
Figure 11:
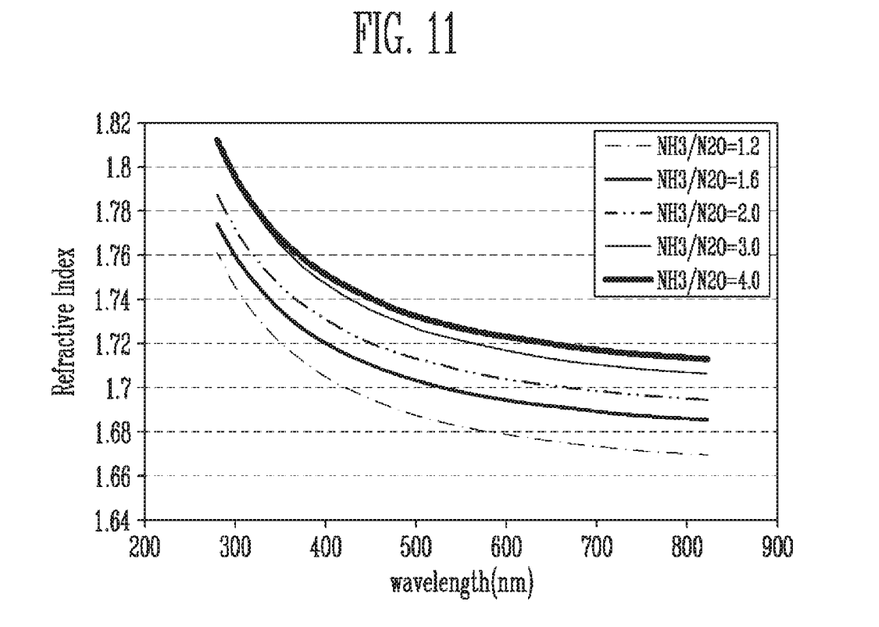
FIG. 11 is a graph for explaining a change in a refractive index of a transparent material layer in accordance with a flow ratio of an ammonia gas and a nitrous oxide gas.

FIGS. 5 to 9 are process cross-sectional views for explaining a method of manufacturing the display panel shown in FIGS. 1 to 4. FIG. 10 is a graph for explaining a change in a refractive index of a transparent material layer in accordance with an applied power. FIG. 11 is a graph for explaining a change in a refractive index of a transparent material layer in accordance with a flow ratio of an ammonia gas and a nitrous oxide gas.

Figure 5:
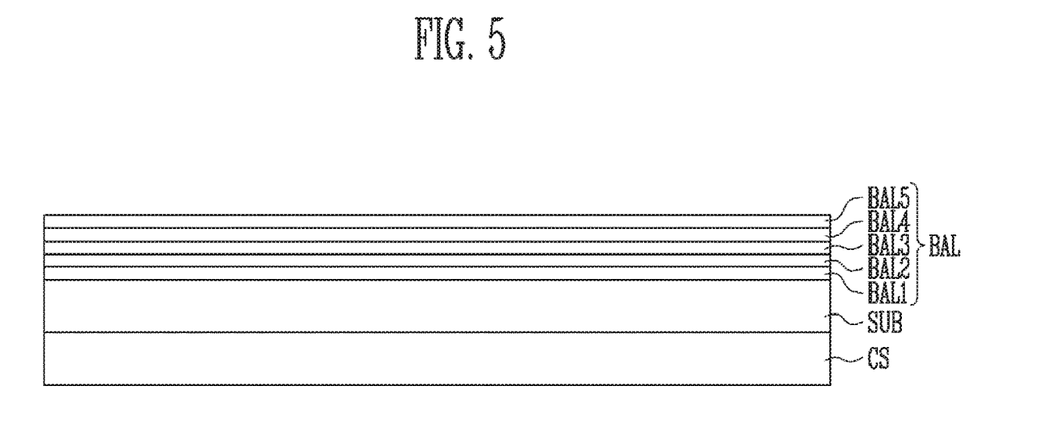
FIGS. 5 to 9 are process cross-sectional views for explaining a method of manufacturing the display panel shown in FIGS. 1 to 4.

Referring to FIG. 5, a base substrate SUB may be formed on a carrier substrate CS.

The carrier substrate CS may be a glass substrate. The carrier substrate CS may be non-flexible. In embodiments, the carrier substrate CS may be a substrate of rigid type. The carrier substrate CS may, in a subsequent process, support the base substrate SUB and prevent deformation of the base substrate SUB from occurring.

The base substrate SUB may be formed by coating high molecular organic matters on the carrier substrate CS. The high molecular organic matters may be one of polyethersulfone (PES), polyacrylate, polyetherimide (PEI), polyethyelenen naphthalate, polyethylene terephthalate (PET), polyphenylene sulfide (PPS), polyallylate (PAR), polyimide (PI), polycarbonate (PC), triacetate cellulose (TAC) or cellulose acetate propionate.

After the base substrate SUB is formed, a barrier layer BAL may be formed on the base substrate SUB. The barrier layer BAL may include a plurality of transparent material layers BAL1, BAL2, BAL3, BAL4 and BAL5. For example, but without limitation, the barrier layer BAL may include first to fifth transparent material layers BAL1, BAL2, BAL3, BAL4 and BAL5.

The barrier layer BAL may be formed as below.

The first transparent material layer BAL1 may be formed on the base substrate SUB. The residual stress of the first transparent material layer BAL1 may be compressive residual stress. The refractive index of the first transparent material layer BAL1 and the refractive index of the base substrate SUB may be different from each other within about 6%.

The first transparent material layer BAL1 may include at least one of silicon oxide (SiOX), silicon nitride (SiNx) or silicon oxynitirde (SiON). In an embodiment, an example may be provided in which the first transparent material layer BAL1 includes silicon oxynitride (SiON).

The first transparent material layer BAL1 may be formed through a plasma enhanced chemical vapor deposition (PECVD) process which uses silane (SiH4) gas, ammonia (NH3) gas, and nitrous oxide (N2O) gas as process gas. By adjusting strength of the power applied in the PECVD process, the refractive index of the first transparent material layer BAL1 may be controlled. As shown in FIG. 10, depending on the strength of the power applied in the PECVD process, the refractive index of the first transparent material layer BAL1 may change. Accordingly, it may be possible to control the first transparent material layer BAL1 to be substantially the same as the refractive index of the base substrate SUB.

After the first transparent material layer BAL1 is formed, a second transparent material layer BAL2 may be formed on the first transparent material layer BAL1. The second transparent material layer BAL2 may include a material that is the same as the first transparent material layer BAL1. A refractive index of the second transparent material layer BAL2 and the refractive index of the first transparent material layer BAL1 may substantially be the same. The residual stress of the second transparent material layer BAL2 may be tensile residual stress.

Under the PECVD condition of the first transparent material layer BAL1, the second transparent material layer BAL2 may be formed by increasing the strength of the power being applied, reducing the flow of the ammonia gas, and increasing the flow of the silane gas. Here, by adjusting the content ratio of oxygen and nitrogen included in the silicon oxynitride, the refractive index of the second transparent material layer BAL2 may be controlled. As shown in FIG. 11, based on the flow ratio of the ammonia gas and the nitrous oxide gas, the refractive index of the second transparent material layer BAL2 may change. Accordingly, it may be possible to adjust the refractive index of the second transparent material layer BAL2 to be substantially the same as the refractive index of the base substrate SUB and the first transparent material layer BAL1.

After the second transparent material layer BAL2 is formed, a third transparent material layer BAL3 may be formed on the second transparent material layer BAL2. The third transparent material layer BAL3 may include a material that is the same as the first transparent material layer BAL1 and the second transparent material layer BAL2. Therefore, a refractive index of the third transparent material layer BAL3 and the refractive index of the second transparent material layer BAL2 may substantially be the same.

The residual stress of the first transparent material layer BAL1 and the third transparent material layer BAL3 may have the same stress properties. The residual stress of the third transparent material layer BAL3 may be compressive residual stress.

After the third transparent material layer BAL3 is formed, a fourth transparent material layer BAL4 may be formed on the third transparent material layer BAL3. The fourth transparent material layer BAL4 may include a material that is the same as the first transparent material layer BAL1, the second transparent material layer BAL2 and the third transparent material layer BAL3. Therefore, a refractive index of the fourth transparent material layer BAL4 and the refractive index of the third transparent material layer BAL3 may substantially be the same.

The residual stress of the second transparent material layer BAL2 and the fourth transparent material layer BAL4 may have the same stress properties. The residual stress of the fourth transparent material layer BAL4 may be compressive residual stress.

After the fourth transparent material layer BAL4 is formed, a fifth transparent material layer BAL5 may be formed on the fourth transparent material layer BAL4. The fifth transparent material layer BAL5 may include a material that is the same as the first transparent material layer BAL1, the second transparent material layer BAL2, the third transparent material layer BAL3 and the fourth transparent material layer BAL4. Therefore, a refractive index of the fifth transparent material layer BAL5 and the refractive index of the fourth transparent material layer BAL4 may substantially be the same.

The residual stress of the first transparent material layer BAL1 and the fifth transparent material layer BAL5 may have the same stress properties. The residual stress of the fifth transparent material layer BAL5 may be compressive residual stress.

The barrier layer BAL may include transparent material layers BAL1, BAL2, BAL3, BAL4 and BAL5 which include the same material as the base substrate SUB. Therefore, light loss may be avoided which may occur due to the difference in refractive index of the barrier layer BAL and the base substrate SUB.

As to the barrier layer BAL, the transparent material layers BAL1, BAL2, BAL3, BAL4 and BAL5 having stress properties in which the layers have different residual stress may be alternately stacked. Therefore, the residual stress applied to the base substrate SUB may be reduced due to the barrier layer BAL.

Figure 6:
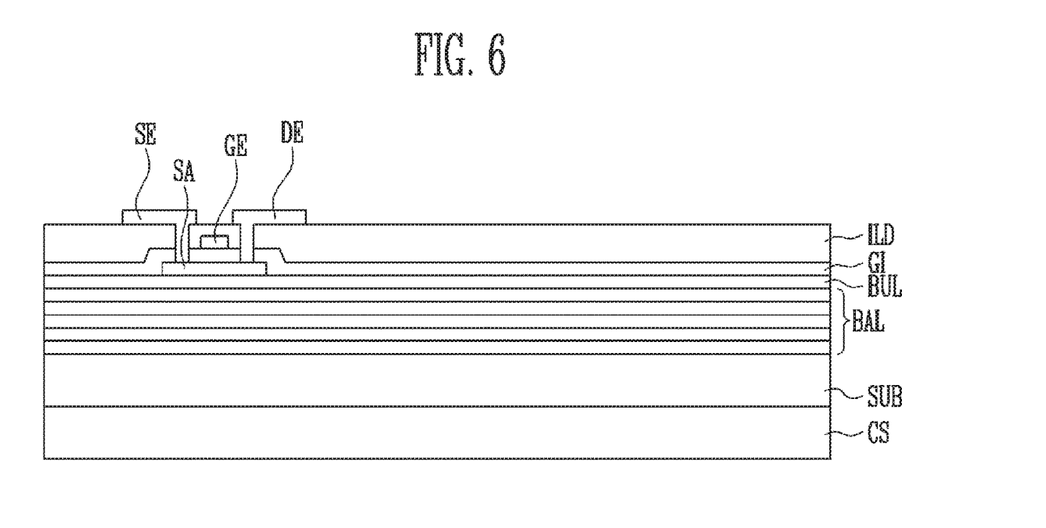

Referring to FIG. 6, after the barrier layer is formed, a buffer layer BUL may be formed on the barrier layer BAL. The buffer layer BUL may include the same material as the first to fifth transparent material layers BAL1, BAL2, BAL3, BAL4 and BAL5. For example, but without limitation thereto, the buffer layer BUL may include silicon oxynitride (SiON) which is formed through the PECVD process. Accordingly, the refractive index of the buffer layer BUL and the refractive index of the fifth transparent material layer BAL5 may be substantially the same.

After the buffer layer BUL is formed, a thin film transistor may be formed on the buffer layer BUL. The thin film transistor may include a semiconductor active layer SA, a gate electrode GE, a source electrode SE and a drain electrode DE.

The thin film transistor may be formed as below.

The semiconductor active layer SA may be formed on the buffer layer BUL. The semiconductor active layer SA may include one of amorphous silicon (a-Si), polycrystalline silicone (p-Si) or oxide semiconductor.

A gate insulating layer GI covering the semiconductor active layer SA may be formed. The gate insulating layer GI may cover the semiconductor active layer SA and insulate the semiconductor active layer SA and the gate electrode GE.

The gate insulating layer GI may include at least one of silicon oxide (SiOx) or silicon nitride (SiNx). For example, but without limitation thereto, the gate insulating layer GI may include the same material as the first to fifth transparent material layers BAL1, BAL2, BAL3, BAL4 and BAL5, for example, silicon oxynitride (SiON). The gate insulating layer GI may have substantially the same refractive index as the buffer layer BUL. The gate insulating layer GI may be formed by depositing the silicon oxynitirde (SiON) on the semiconductor active layer SA.

The gate insulating layer GI may include a first layer including silicon oxide (SiOx) disposed on the semiconductor active layer SA and a second layer disposed on the first layer and including silicon oxynitride disposed on the first layer. The gate insulating layer GI may be formed by depositing the second layer which includes silicon oxynitride (SiON) on the first layer after depositing the first layer which includes the silicon oxide (SiOx) on the semiconductor active layer SA.

The first layer which includes the silicon oxide may have superior adhesive strength with the semiconductor active layer SA. Also, interface stability of the first layer and the semiconductor active layer SA may be superior. Although damage may occur to the semiconductor active layer SA when the gate insulating layer GI is formed, the first layer may prevent the semiconductor active layer SA from being damaged when the gate insulating layer GI is formed.

After the gate insulating layer GI is formed, a conductive metal layer may be formed on the gate insulating layer GI and patterned to form the gate electrode GE. The gate electrode GE may be disposed overlapping the semiconductor active layer SA. The gate electrode GE may include at least one of aluminum (Al), aluminum alloy (Al alloy), silver (Ag), tungsten (W), copper (Cu), nickel (Ni), chrome (Cr), molybdenum (Mo), titanium (Ti), platinum (Pt), tantalum (Ta), neodymium (Nd), scandium (Sc) or any alloy thereof.

After the gate electrode GE is formed, an interlayer insulating layer ILD may be formed. The interlayer insulating layer ILD may insulate the gate electrode GE and the source electrode and the drain electrode DE. The interlayer insulating layer ILD may include the same material as the first to fifth transparent material layers BAL1, BAL2, BAL3, BAL4 and BAL5. The refractive index of the interlayer insulating layer ILD and the refractive index of the gate insulating layer GI may be substantially the same.

After the interlayer insulating layer ILD is formed, a part of the semiconductor active layer SA may be exposed by patterning the interlayer insulating layer ILD. An area exposed from the semiconductor active layer SA may be an area coming into contact with the source electrode SE and the drain electrode DE which may be subsequently formed.

By forming a conductive layer on the interlayer insulating layer ILD and patterning it, the source electrode SE and the drain electrode DE may be formed.

Figure 7:
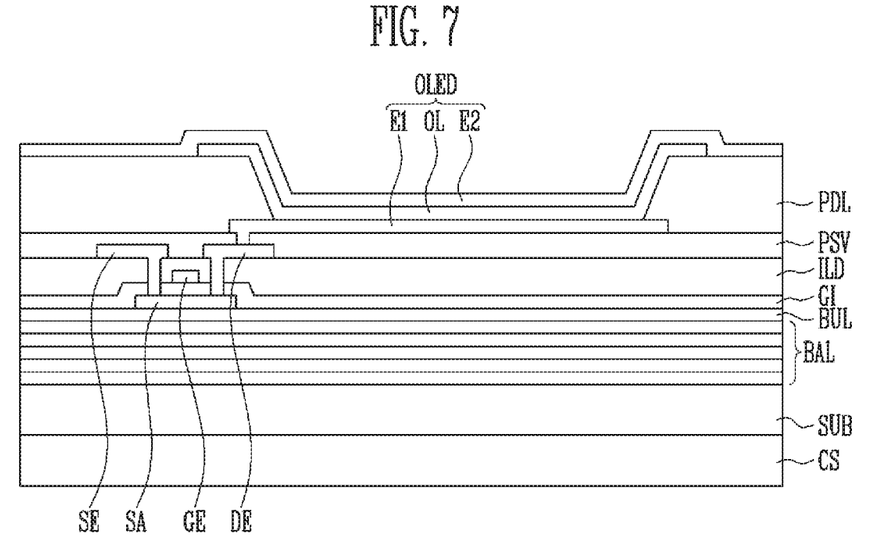

Referring to FIG. 7, after the thin film transistor is formed, a protective layer PSV which covers the thin film transistor may be formed. The protective layer PSV may include at least one layer. For example, but without limitation thereto, the protective layer may be an organic protective layer. The organic protective layer PSV may include one of acryl, polyimide (PI), polyamide (PA), or benzocyclobutene (BCB). The organic protective layer may be transparent and have fluidity and it may be a planarizing layer capable of flattening by alleviating a bend or a curve of a structure of a lower portion.

The protective layer PSV may include an inorganic protective layer and an organic protective layer disposed on the inorganic protective layer. The inorganic protective layer may include the same material as the first to fifth transparent material layers BAL1, BAL2, BAL3, BAL4 and BAL5. Therefore, the refractive index of the inorganic protective layer and the refractive index of the interlayer insulating layer ILD may be substantially the same.

After the protective layer PSV is formed, a part of the drain electrode DE may be exposed by patterning the protective layer PSV.

A display device OLED may be formed, which contacts the drain electrode DE. The display device OLED may include a first electrode E1 which is a transmissive electrode capable of allowing light to pass through, an organic layer OL disposed on the first electrode E1 and a second electrode E2 which is a reflective electrode disposed on the organic layer OL and capable of reflecting light.

The display device OLED may be formed as follows.

A transparent conductive oxide layer may be formed on the protective layer PSV. The first electrode E1 may be formed by patterning the transparent conductive oxide layer. The first electrode E1 may come in contact with the drain electrode DE. The transparent conductive oxide layer may include one of indium tin oxide (ITO), indium zinc oxide (IZO), aluminum zinc oxide (AZO), gallium doped zinc oxide (GZO), zinc tin oxide (ZTO), gallium tin oxide (GTO) or fluorine doped tin oxide (FTO).

After the first electrode E1 is formed, a pixel defining layer PDL may be formed which exposes a part of the first electrode E1 on the first electrode E1. The pixel defining layer PDL may be formed by forming an organic insulating material layer to cover the first electrode E1 and patterning the organic insulating material layer. The pixel defining layer PDL may include at least one of polystyrene, poly (methyl methacrylate) (PMMA), polyacrylonitrile (PAN), polyamide, polyimide, polyarylether, heterocyclic polymer, parylene, fluorinated polymer, epoxy resin, benzocyclobutene series resin, siloxane series resin or silane resin.

After the pixel defining layer PDL is formed, an organic layer OL may be formed on the first electrode E1 exposed by the pixel defining layer PDL. The organic layer OL may include at least an emitting layer EML and generally have a multi-layer thin film structure. For example, but without limitation thereto, the organic layer OL may be formed by sequentially stacking a hole injection layer HIL, a hole transport layer HTL, the emitting layer EML, a hole blocking layer HBL, an electron transport layer ETL and an electron injection layer EIL.

After the organic layer OL is formed, a second electrode E2 may be formed on the organic layer OL. Accordingly, a thin film transistor substrate 110 which includes the base substrate SUB, the barrier layer BAL, the thin film transistor and the display device OLED may be formed.

The second electrode E2 may have a work function that is lower than the first electrode E1. The second electrode E2 may include a material with superior reflectance. For example, but without limitation thereto, the second electrode E2 may include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca) or any alloy thereof.

In embodiments, after the second electrode E2 is formed, a conductive layer for preventing IR-drop of the second electrode E2 may be formed on the second electrode E2.

Figure 8:
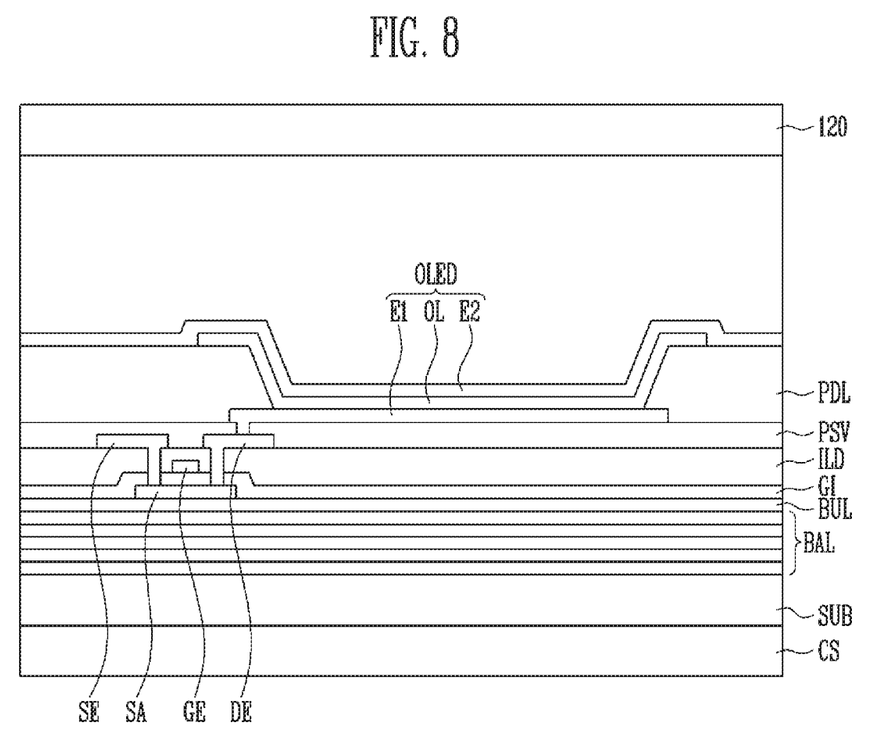

Referring to FIG. 8, after the display device OLED is formed, a sealing member 120 which isolates the display device OLED from the external environment may be formed. The sealing member 120 may be an opposed substrate, for example. The sealing member 120 may be a flexible substrate.

If the sealing member 120 is an opposed substrate, after the sealing member 120 is disposed to face the thin film transistor substrate 110, the thin film transistor substrate 110 and the sealing member 120 may be attached using a sealant.

Figure 9:
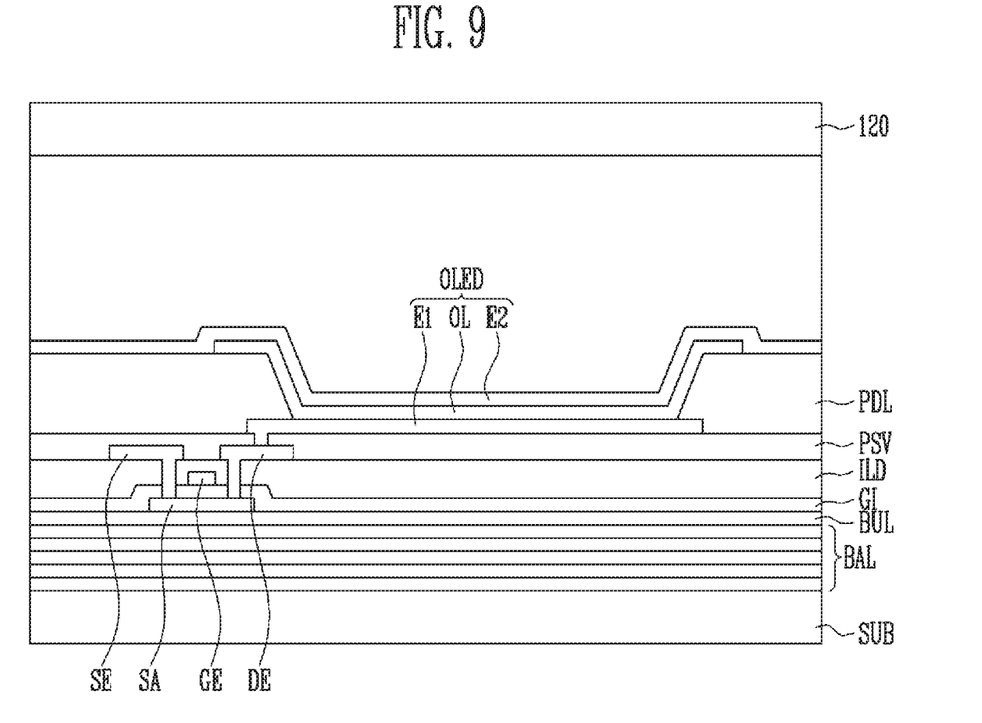

Referring to FIG. 9, after the sealing member 120 is formed, the carrier substrate CS may be removed. For example, but without limitation thereto, the carrier substrate CS may be easily removed by applying heat or irradiating a laser beam from a surface of an opposite direction of a surface where the base substrate SUB of the carrier substrate CS is formed.

Figure 12:
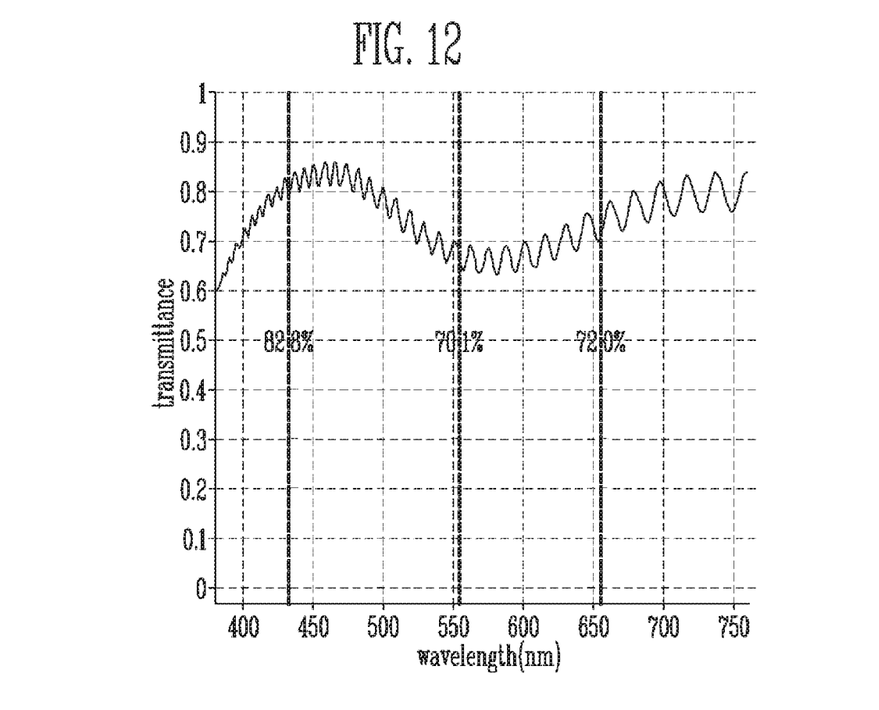
FIGS. 12 to 14 are simulation graphs for explaining a light transmittance in accordance with a structure of a barrier layer disposed on a base substrate.
Figure 13:
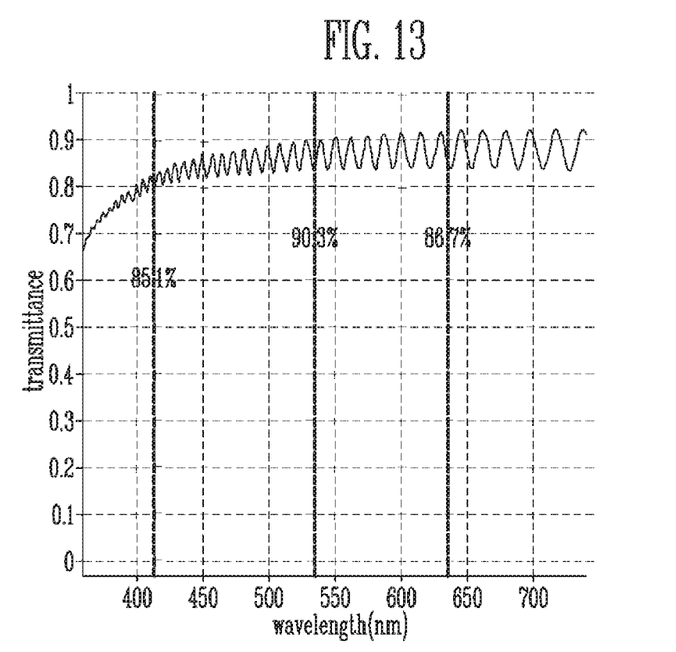
Figure 14:
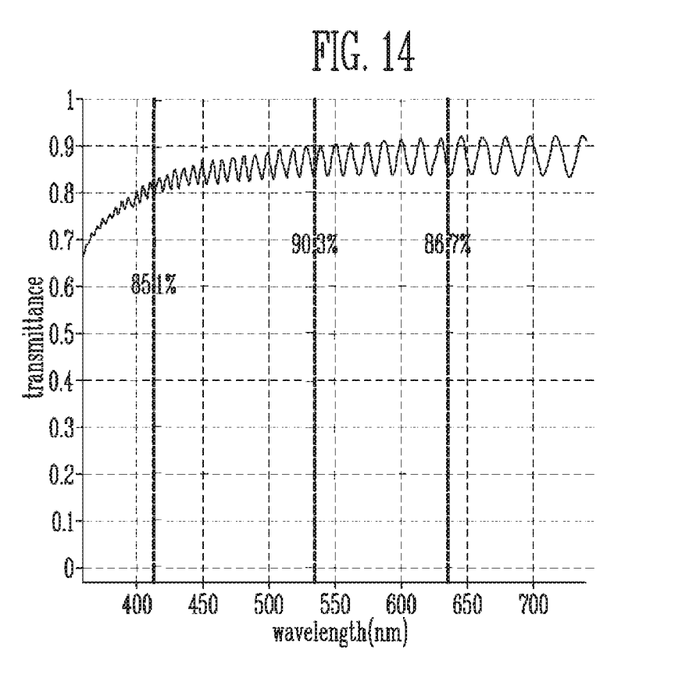

FIGS. 12 to 14 are simulation graphs for explaining a light transmittance in accordance with a structure of a barrier layer disposed on a base substrate.

Referring to FIGS. 12 to 14, the base substrate may include polyimide and have a thickness of approximately 10 μm. Also, the barrier layer may be disposed on the base substrate.

The barrier layer shown in FIG. 12 may include a silicon oxide layer having a thickness of approximately 1500 Å, a silicon nitride layer having a thickness of approximately 600 Å, and a silicon nitride layer of approximately 1500 Å. The stacked structure of the base substrate and the barrier layer shown in FIG. 12 may have light transmittance with respect to approximately 72.0% red light (660 nm), light transmittance with respect to approximately 70.1% green light (558 nm), light transmittance with respect to approximately 82.8% blue light (428 nm) and approximately 69.6% average light transmittance.

The barrier layer shown in FIG. 13 may be a single silicon oxynitride layer having a thickness of approximately 5700 Å. The refractive index of the barrier layer may be approximately 1.7 which is the same as the refractive index of the base substrate. The stacked structure of the base substrate and the barrier layer shown in FIG. 13 may have light transmittance with respect to approximately 86.7% red light (660 nm), light transmittance with respect to approximately 90.3% green light (558 nm), light transmittance with respect to approximately 85.1% blue light (428 nm) and approximately 86.9% average light transmittance.

The barrier layer shown in FIG. 14 may include a silicon oxynitride layer having a thickness of approximately 1500 Å and whose residual stress is compressive residual stress, a silicon oxynitirde layer having a thickness of approximately 600 Å and whose residual stress is tensile residual stress, a silicon oxynitride layer having a thickness of approximately 1500 Å and whose residual stress is compressive residual stress, a silicon oxynitride layer having a thickness of approximately 600 Å and whose residual stress is tensile residual stress and a silicon oxynitride layer having a thickness of approximately 1500 and whose residual stress is compressive residual stress. The refractive index of the silicon oxynitride layers is approximately 1.7, which is the same as the refractive index of the base substrate.

The stacked structure of the base substrate and the barrier layer shown in FIG. 14 may have light transmittance with respect to approximately 86.7% red light (660 nm), light transmittance with respect to approximately 90.3% green light (558 nm), light transmittance with respect to approximately 85.1% blue light (428 nm) and approximately 86.9% average light transmittance.

Compared to the light transmittance of the barrier layer in which the silicon oxide layer and silicon nitride layer are alternately stacked on the base substrate which includes polyimide, it can be observed that the light transmittance of the barrier layer where silicon oxynitride layer is disposed on the polyimide base substrate is superior.

Meanwhile, as shown in FIG. 13, the barrier layer of the single layer structure may have a bigger residual stress than the barrier layer shown in FIG. 14. In the barrier layer shown in FIG. 14, material layers that have different residual stress properties may be alternately stacked. The material layers may relieve residual stress of each other. Therefore, compared to the barrier layer of single layer structure, the barrier layer shown in FIG. 14 may maintain a state in which residual stress is relieved.

Embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor array panel device comprising:
a base substrate;
a barrier layer disposed over the base substrate and comprising a plurality of transparent material layers, each of which is substantially transparent and comprises silicon oxynitride (SiON); and
an array of thin film transistors disposed over the barrier layer, wherein the plurality of transparent material layers comprise first and second transparent material layers and wherein the first transparent material layer has compressive residual stress and the second transparent material layer has tensile residual stress.

2. The device as claimed in claim 1, wherein the first and second transparent material layers are immediately neighboring each other without any intervening transparent material layer therebetween.

3. The device as claimed in claim 2, wherein the barrier layer comprises a multi-layered structure of the transparent material layers arranged such that the transparent material layers having compressive residual stress and the transparent material layers having tensile residual stress are alternately stacked.

4. The device as claimed in claim 3, wherein the plurality of transparent material layers comprises an uppermost transparent material layer and lowermost transparent material layer which have compressive residual stress.

5. The device as claimed in claim 1, further comprising a buffer layer disposed between the barrier layer and the thin film transistors,
wherein the buffer layer comprises silicon oxynitride (SiON).

6. The device as claimed in claim 1, wherein each thin film transistor comprises a semiconductor active layer, a gate electrode, a source electrode and a drain electrode,
wherein the thin film transistor array panel device further comprises a gate insulating layer disposed between the semiconductor active layer and the gate electrode, wherein the gate insulating layer comprises silicon oxynitride (SiON).

7. The device as claimed in claim 1, further comprising an interlayer insulating layer insulating the gate electrode and the source electrode and the drain electrode,
wherein the interlayer insulating layer comprises silicon oxynitride (SiON).

8. A display panel comprising:
the thin film transistor array panel device of claim 1; and
an array of pixels disposed over the thin film transistor array panel.

9. The display panel as claimed in claim 8, wherein the first and second transparent material layers are immediately neighboring each other without any intervening transparent material layer therebetween.

10. The display panel as claimed in claim 9, wherein the barrier layer comprises a multi-layered structure of the transparent material layers arranged such that the transparent material layers having compressive residual stress and the transparent material layers having tensile residual stress are alternately stacked.

11. The display panel as claimed in claim 10, wherein the plurality of transparent material layers comprises an uppermost transparent material layer and a lowermost transparent material layer which have compressive residual stress.

12. The display panel as claimed in claim 8, wherein the thin film transistor array panel device further comprises a buffer layer disposed between the barrier layer and the thin film transistors,
wherein the buffer layer comprises silicon oxynitride (SiON).

13. The display panel as claimed in claim 8, wherein each thin film transistor comprises a semiconductor active layer, a gate electrode, a source electrode and a drain electrode,
wherein the thin film transistor array panel device further comprises a gate insulating layer disposed between the semiconductor active layer and the gate electrode, wherein the gate insulating layer comprises silicon oxynitride (SiON).

14. The display panel as claimed in claim 13, wherein the thin film transistor array panel device further comprises an interlayer insulating layer insulating the gate electrode and the source electrode and the drain electrode,
wherein the interlayer insulating layer comprises silicon oxynitride (SiON).

15. The display panel as claimed in claim 8, wherein a difference between a refractive index of the transparent material layers and a refractive index of the base substrate is within about 5.5%.

16. A thin film transistor array panel device comprising:
a base substrate;
a barrier layer disposed over the base substrate and comprising a plurality of transparent material layers, each of which is substantially transparent and comprises silicon oxynitride (SiON); and
an array of thin film transistors disposed over the barrier layer, wherein a difference between a refractive index of the transparent material layers and a refractive index of the base substrate is within about 6%.

* * * * *